US007087529B2

(12) United States Patent
Fang et al.

(10) Patent No.: US 7,087,529 B2
(45) Date of Patent: Aug. 8, 2006

(54) CHEMICAL-MECHANICAL POLISHING (CMP) SLURRY AND METHOD OF PLANARIZING SURFACES

(75) Inventors: Mingming Fang, Naperville, IL (US); Michael R. Ianiro, Macon, GA (US); Don D. Eisenhour, Grayslake, IL (US)

(73) Assignee: Amcol International Corporation, Arlington Heights, IL (US)

( * ) Notice: Subject to any disclaimer, the term of this patent is extended or adjusted under 35 U.S.C. 154(b) by 209 days.

(21) Appl. No.: 10/677,433

(22) Filed: Oct. 2, 2003

(65) Prior Publication Data

US 2005/0074975 A1    Apr. 7, 2005

(51) Int. Cl.
    *H01L 21/302*     (2006.01)
(52) U.S. Cl. .................. 438/692; 51/307; 51/308; 51/298; 210/631; 424/443
(58) Field of Classification Search ................ 438/692, 438/693; 451/37, 57; 505/933; 51/308
    See application file for complete search history.

(56) References Cited

U.S. PATENT DOCUMENTS

| 5,340,370 A | | 8/1994 | Cadien et al. | |
|---|---|---|---|---|
| 5,527,423 A | | 6/1996 | Neville et al. | |
| 5,575,915 A | * | 11/1996 | Nakamura et al. | .......... 210/631 |
| 5,622,525 A | | 4/1997 | Haisma et al. | |
| 5,669,942 A | | 9/1997 | McCullough | |
| 5,942,015 A | * | 8/1999 | Culler et al. | .................. 51/295 |
| 5,958,794 A | | 9/1999 | Bruxvoort et al. | |
| 6,380,295 B1 | * | 4/2002 | Ross et al. | .................. 524/443 |
| 6,475,071 B1 | * | 11/2002 | Joslyn | .......................... 451/60 |
| 6,602,439 B1 | | 8/2003 | Hampden-Smith et al. | |
| 2004/0216388 A1 | * | 11/2004 | Mathur et al. | ................. 51/298 |

FOREIGN PATENT DOCUMENTS

| EP | 0 103 085 A1 | 3/1984 |
|---|---|---|
| WO | WO-02/024759 A2 | 3/2002 |
| WO | WO-03/064551 A1 | 8/2003 |
| WO | WO-2004/063301 A1 | 7/2004 |
| WO | WO-2004/083328 A2 | 9/2004 |

OTHER PUBLICATIONS

Protien Concentration and Diafiltration by Tangential Flow Filtration; Lit. No. TB032; Rev. C; Jun. 2003; 03-117; 2003 Corp., Billerica, MA 01821 U.S.A.*
U.S. Appl. No. 60/455216, filed Mar. 2003, Marthur et al.*
Mabic et al. of the R&D Notebook: A publication of the Laboratory Water Division of Millipore; RD006; Quantification studey of a point-of-use ultrafiltration device for the production of pyrogen-free ultrapure water; (Research and Development, Laboratory.*

* cited by examiner

*Primary Examiner*—Nadine G. Norton
*Assistant Examiner*—Patricia George
(74) *Attorney, Agent, or Firm*—Marshall, Gerstein & Borun LLP

(57) ABSTRACT

A chemical-mechanical abrasive composition for use in semiconductor processing uses abrasive particles having a non-spherical morphology.

10 Claims, 3 Drawing Sheets

CHEMICAL-MECHANICAL POLISHING (CMP) SLURRY AND METHOD OF PLANARIZING SURFACES

TECHNICAL FIELD

The present invention is directed to a clay-containing abrasive composition and method of planarizing or polishing metal and/or insulator (dielectric) surfaces. The composition is used as purified clay-containing aqueous slurry, particularly useful in the manufacture of semiconductor devices, e.g., integrated circuits, wafers, memory disks and rigid disks.

BACKGROUND

Compositions for planarizing or polishing the surface of a substrate are well known in the art. Polishing slurries typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium.

Conventional polishing compositions typically are not entirely satisfactory at planarizing semiconductor wafers or integrated circuits having alternating layers of conductive metal and insulating material, e.g., silicon dioxide, that require planar surfaces. In particular, polishing slurries can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition that has a high polishing efficiency, uniformity, and removal rate and leaves a high quality polish with minimal surface defects.

The difficulty in creating an effective polishing composition for semiconductor wafers stems from the complexity of the semiconductor wafer. Semiconductor wafers are typically composed of a substrate, on which a plurality of transistors are formed. Integrated circuits are physically connected into the substrate by patterning metal and insulating layers while interconnecting desired metal regions through intermediate insulating, e.g., $SiO_2$, layers. To produce an operable semiconductor wafer and to maximize the yield, performance, and reliability of the wafer, it is desirable to polish selected surfaces of the wafer without adversely affecting underlying structures or topography. Various problems in semiconductor fabrication can occur if the process steps are not performed on wafer surfaces that are adequately planarized.

There have been many attempts to improve the polishing efficiency and uniformity of conventional polishing agents, while minimizing defects in the polished surface and damage to underlying structures or topography. For example, U.S. Pat. No. 5,340,370 describes a polishing composition comprising an abrasive, an oxidizing agent, and water, which purportedly yields an improved removal rate and polishing efficiency. Similarly, U.S. Pat. No. 5,622,525 describes a polishing composition comprising colloidal silica having an average particle size of 20–50 nm, a chemical activator, and demineralized water.

A need remains, however, for compositions and methods that will exhibit desirable planarization efficiency, uniformity, and removal rate during the polishing and planarization of substrates, particularly semiconductor wafer surfaces, while minimizing defects, such as surface imperfections and damage to underlying structures and topography during polishing and planarization.

BRIEF SUMMARY

Disclosed are compositions and methods for planarizing or polishing a surface, particularly a semiconductor wafer surface. The polishing compositions described herein comprise (a) a liquid carrier; (b) purified clay; and optional additives, such as (c) a chemical accelerator; and (d) a complexing or coupling agent capable of chemically or ionically complexing with, or coupling to, the metal and/or insulating material removed during the polishing process. The complexing or coupling agent carries away the removed metal and/or silicon dioxide insulator particles, during polishing, to prevent the separated particles from returning to the surface from which they were removed. Also disclosed are methods of planarizing or polishing a surface comprising contacting the surface with the compositions.

Accordingly, one aspect of the compositions and methods described herein is to provide a method for planarizing or polishing metal and/or insulator (dielectric) surfaces using purified clay particles as abrasive particles.

Another aspect is to provide a method for planarizing or polishing metal and/or insulator surfaces using cation-exchangeable, essentially sodium-free clay particles (less than 0.5 wt. %, preferably less that 0.4 wt. %, more preferably less than 0.2 wt. % Na), preferably essentially sodium-free ion-exchanged smectite clay particles, as the abrasive material.

Still another aspect of the compositions and methods described herein is to provide clay abrasive particles, in a water/clay particle slurry having clay abrasive particles dispersed throughout the water and having a particle size such that at least 90% of the clay particles (by number) have a mean particle size in the range of 0.002 µm to 10 µm, preferably 0.02 µm to 5 µm, more preferably such that at least 90% of the particles have a mean particle size of 0.1 µm to 4 µm, to provide a slurry capable of planarizing metal and/or insulator surfaces.

Another aspect of the compositions and methods described herein is to provide a planarizing composition that comprises an aqueous slurry of clay abrasive particles in an amount of 0.1 to about 40 wt. % of the slurry; an oxidizing agent accelerator in an amount of 0.01 wt. % to about 20 wt. % of the slurry, preferably about 0.1% to about 5 wt. %, and a chelating agent or complexing agent in an amount of about 0.1 wt. % to about 20 wt. %, preferably about 0.2 wt. % to about 5 wt. %, more preferably about 0.5 to about 2 wt. %, e.g., 1 wt. %.

The above and other aspects and advantages of the compositions and methods described herein will become more apparent from the following description of the preferred embodiments, taken in conjunction with the drawings.

DESCRIPTION OF THE PREFERRED EMBODIMENTS

Figure 1:
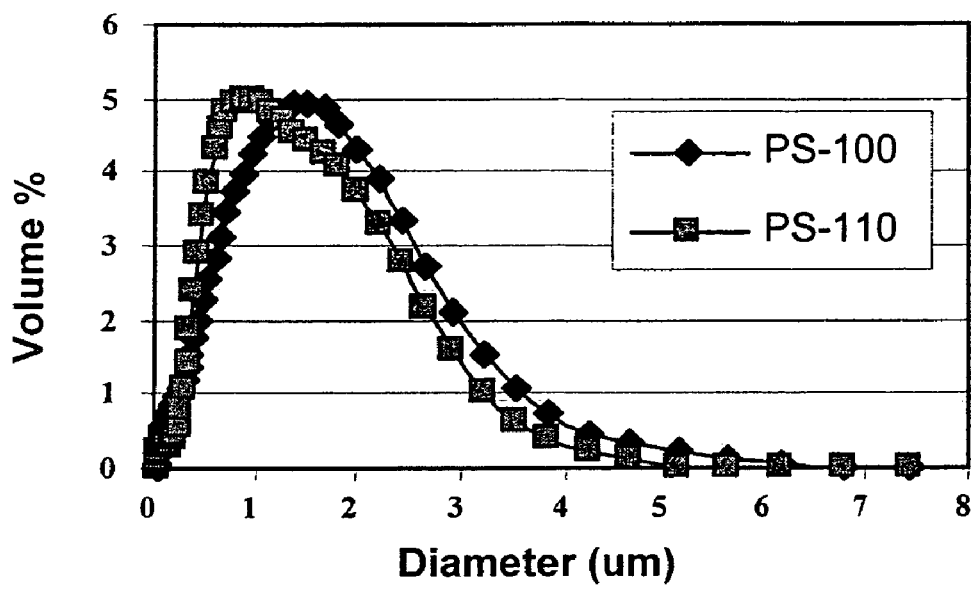
FIG. 1 is a graph showing the particles size distribution of purified smectite clays that have been ion-exchanged with $Ca^{++}$ cations and $NH_4^+$ cations, in accordance with a preferred embodiment.
Figure 2:
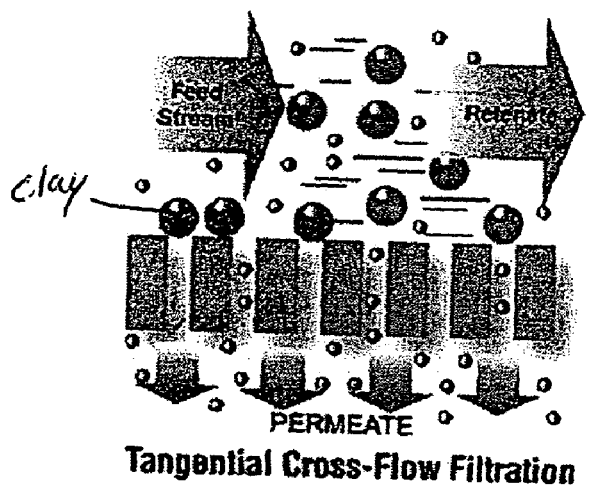
FIG. 2 is a schematic, magnified drawing showing filtration of $Na^+$-containing water from a dilute mixture, e.g., 2 wt. % ion-exchanged clay, of ion-exchanged clay and water, via hollow-fiber targential flow filtration.

The polishing compositions comprise (a) a liquid carrier; (b) purified clay; and optional additives, such as (c) a chemical accelerator; and (d) a complexing or coupling agent capable of chemically or ionically complexing with, or coupling to, the removed metal or insulating material being planarized. The compositions are useful in planarizing or polishing a surface. The compositions provide for high polishing efficiency, uniformity, and removal rate of a surface, including both metal and insulative surfaces of a semiconductor wafer, with minimal defects, such as field loss of underlying structures and topography.

The total solids can be present in any suitable concentration in the compositions described herein. The solids desirably are present in a concentration of about 0.1 wt. % or more (e.g., about 0.1–40 wt. %). Preferably, the total solids concentration is about 0.1–30 wt. % of the composition.

The abrasive particles of the compositions described herein comprise a purified clay, preferably one or more ion-exchangeable smectite clays, that may be dioctahedral and/or trioctahedral smectite clays that are ion-exchanged with exchange cations selected from ammonium cations, or any alkali metal cations or alkaline earth metal cations except for lithium or sodium. The preferred cations for ion-exchange with exchangeable cations contained in the clay are $Ca^{++}$, $NH_4^+$, $K^+$, and $Ba^{++}$, or a mixture of two or more of said cations. Suitable dioctahedral and trioctahedral smectite clays that can be ion-exchanged with the above-mentioned cations include the following:

Dioctahedral: Beidellite; montmorillonite; Nontronite; and Volkonskoite.

Trioctahedral: Saponite; and Hectorite.

Other clays that are useful as abrasive particles include both natural and synthetic clays, such as the following: Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups.

Optionally, an oxidizing component can be incorporated into the polishing composition to promote oxidation of a metal layer to its corresponding oxide. For example, an oxidizing component can be used to oxidize tungsten to tungsten oxide; thereafter, the tungsten oxide can be chemically and/or mechanically polished and removed. As a further example, the oxidizing component can oxidize copper to cuprous oxide or cupric oxide for more efficient removal and better planarization. Preferred oxidizing components include oxidizing salts, oxidizing metal complexes, iron salts, such as nitrates, sulfates, potassium ferri-cyanide and the like, aluminum salts, quaternary ammonium salts, phosphonium salts, peroxides, chlorates, perchlorates, permanganates, persulfates and mixtures thereof. Other suitable oxidizers can include, for example, oxidized halides (e.g., chlorates, bromates, iodates, perchlorates, perbromates, periodates, mixtures thereof, and the like). Suitable oxidizers also can include, for example, perboric acid, perborates, percarbonates, nitrates, persulfates, peroxides, e.g., hydrogen peroxide, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricynaide), mixtures thereof, and the like. The amount should be sufficient to ensure rapid oxidation of the metal layer while balancing the mechanical and chemical polishing performance of the system.

Other possible additives include filters, fibers, lubricants, wetting agents, pigments, dyes, coupling agents, plasticizers, surfactants, dispersing agents, suspending agents, chelating or complexing agents, catalysts, and the like. The polishing pad matrix material can comprise up to 80 weight percent filler and other optional ingredients. Examples of optional additives include EDTA, citrates, polycarboxylic acids and the like.

Any suitable chemical accelerator can be present in the composition. The optional chemical accelerator acts to improve the planarization or polishing of a substrate, for example, as evidenced by an increased rate of substrate removal.

Suitable chelating or complexing agents can include, for example, glycine, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups, and the like. Suitable chelating or complexing agents also can include, for example, di-, tri-, or poly-alcohols (e.g., ethylene glycol, procatechol, pyrogallol, tannic acid, and the like) and amine-containing compounds (e.g., amino acids, amino alcohols, di-, tri-, or poly-alcohols (e.g., ethylene glycol, pyrocatechol, pyrogallol, tannic acid, and the like) and amine-containing compounds (e.g., amino acids, amino alcohols, di-, tri-, and poly-amines, and the like). Suitable polishing accelerators also can include, for example, sulfates, halides (i.e., fluorides, chlorides, bromides, and iodides), and the like.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof, phthalates include phthalic acid, as well as mono-salts (e.g., potassium hydrogen phthalate) and di-salts thereof; perchlorates include the corresponding acid (e.g., perchloric acid), as well as salts thereof. Furthermore, certain compounds may perform more than one function. For example, some compounds can function both as a chelating and an oxidizing agent (e.g., certain ferric nitrates and the like).

Preferably, the optional chemical accelerator is a peroxide, such as hydrogen peroxide.

If a chemical accelerator is included in the polishing composition, any suitable amount can be used. The chemical accelerator desirably is present in the polishing composition in an amount of about 0.01–20 wt. %; preferably about 0.7 wt. % to about 10 wt. %). Preferably, a chemical accelerator is present in the composition in an amount of about 0.75 wt. % to about 5 wt. %. More preferably, a chemical accelerator is present in the composition in an amount of about 0.5 to 4 wt. %, particularly 0.8 to 2.0 wt. %.

The composition can further include one or more other components, such as surfactants, polymeric stabilizers or other surface active dispersing agents, pH adjusters, regulators, or buffers, and the like. Suitable surfactants can include, for example, cationic surfactants, anionic surfactants, nonionic surfactants, amphoteric surfactants, fluorinated surfactants, mixtures thereof, and the like. Suitable polymeric stabilizers or other surface active dispersing agents can include, for example phosphoric acid, organic acids, tin oxides, organic phosphonates, mixtures thereof, and the like. Suitable pH adjusters, regulators, or buffers can include, for example, sodium hydroxide, sodium carbonate, sulfuric acid, hydrochloric acid, nitric acid, phosphoric acid, citric acid, potassium phosphate, mixtures thereof, and the like.

Any suitable carrier (e.g., solvent) can be used in the composition of the present invention. A carrier is used to facilitate the application of the abrasive purified clay particles onto the surface of a suitable substrate. A preferred carrier is water.

The pH of the composition is maintained in a range suitable for its intended end-use. The composition desirably has a pH of about 2–12. the preferred pH will depend on the particular chemical accelerator. For example, when the chemical accelerator is ammonium persulfate and $NH_3$, then the pH preferably is about 9–11. When the chemical accelerator is iron (III) nitrate, then the pH preferably is about 2.5 or less, more preferably about 2. When the chemical accelerator is hydroxylamine nitrate, then the pH preferably is about 2–5.

The method of planarizing or polishing a surface comprises contacting a surface with a composition as described herein. A surface can be treated with the composition by any suitable technique. For example, the composition can be applied to the surface through use of a polishing pad. The rate of removal of silicon dioxide, and/or metal is dependent on the rotational speed of the pad the downward force applied to the pad, and the flow rate of the abrasive composition, as well known in the art.

The compositions are capable of planarizing or polishing a substrate at a relatively high rate, e.g., removing the silicon dioxide insulator layer or conductive metal, e.g., copper, tungsten and/or aluminum, from a layered substrate at a relatively high rate. Furthermore, the compositions of the present invention are well-suited for the planarizing or polishing of many hardened workpieces, such as memory or rigid disks, metals (e.g., noble metals), ILD layers, semiconductors, micro-electro-mechanical devices, ferroelectrics, magnetic heads, polymeric films, and low and high dielectric constant films. The compositions also can be used in the manufacture of integrated circuits and semiconductors. The compositions described herein exhibit desirable planarization efficiency, uniformity, removal rate, and low defectivity during the polishing and planarization of substrates.

In accordance with an important feature of the compositions and methods described herein, the abrasive particles comprise at least 10% by weight, more preferably at least about 20% by weight, and up to 100% by weight, based on the total weight of abrasive particles in the slurry composition, of a purified clay, preferably a calcium montmorillonite or ammonium montmorillonite clay. Other suitable types of clays include any of the dioctahedral and/or trioctahedral smectite clays that are ion-exchanged with $Ca^{++}$ or $NH_4^+$ cations. Suitable other dioctahedral and trioctahedral smectite clays that can be ion-exchanged with $Ca^{++}$ and/or $NH_4^+$ cations include Beidellite; Nontsonite; Volkonskoite; Saponite; and Hectorite. Other clays that are useful as abrasive particles include both natural and synthetic clays, such as the following: Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups.

The preferred clay starting material is a sodium smectite clay, such as sodium montmorillonite and/or sodium bentonite, having sodium as its predominant exchangeable interlayer cation. Sodium smectite clays are preferred since they can be easily exfoliated into individual platelets, when dispersed in aqueous solutions, for better access of the exchange cations to, and easier ion-exchange with, the exchangeable sodium cations on the platelet surfaces using any of the above-mentioned exchange cations. The clay is first ground to a particle size such that at least 90% of the abrasive particles (by number) have a particle size of about 5 μm to about 200 μm, more preferably about 10 μm to 100 μm, most preferably about 20 μm to about 50 μm and suspended in water, as a dilute aqueous suspension, e.g., less than about 5% by weight clay, preferably about 1% by weight clay, based on the total weight of clay and water. The dilute suspension then is subjected to high shear conditions, e.g., using a waring blender at 15,000 rpm for 10 to 20 minutes and the sheared suspension is allowed to settle, e.g., for 24 hours, to settle the grit, quartz, and other non-clay impurities. The sediment is discarded and the supernatant dilute suspension is collected for an ion-exchange step in which the exchangeable sodium ions are exchanged for calcium and/or ammonium ions. The ion exchange step is achieved by adding a water-soluble calcium salt and/or a water-soluble ammonium salt to the dilute aqueous suspension of clay. The preferred calcium salt is calcium chloride and the preferred ammonium salt is ammonium chloride. The amount of calcium and/or ammonium salts dissolved in the dilute clay suspension is a molar amount at least equal to the cation exchange capacity (CEC) of the clay, and preferably 1.1 to 100 times, more preferably 2 to 50 times, most preferably 5 to 20 times the amount of $Ca^{++}$ and/or $NH_4^+$ cations needed to completely exchange $Ca^{++}$ or $NH_4^+$ for the exchangeable cations, including the exchangeable $Na^+$ cations in the clay. The dilute clay suspension containing dissolved salts that provide excess $Ca^{++}$ and/or $NH_4^+$ cations, is then mechanically mixed, e.g., in a COFRAMO mixer at, for example, 800 rpm for at least about 10 minutes, e.g., 10–30 minutes, preferably about 20 minutes to fully exchange the exchangeable sodium ions in the clay for calcium and/or ammonium cations.

In accordance with an important feature of the present invention, the dilute suspension of ion-exchanged calcium and/or ammonium ion-exchanged clay is filtered through a hollow fiber tangential flow filtration apparatus to remove at least 90% by weight of the free sodium ions in the diluents water, without the sodium ions being absorbed by the clay, as would occur with common filtration apparatus and drying steps used to separate the clay from the suspension water after an ion-exchange step.

It has been found that removal of the free sodium ions from the dilute solution (after ion exchange with calcium and/or ammonium ions) is accomplished very efficiently by processing the ion-exchanged clay and $Na^+$—containing diluent water through a hollow-fiber tangential flow filtration apparatus, such as a MINTKROSS® or CELLFLO® apparatus obtained from SPECTRUM LABS.

The ion-exchanged clay and $Na^+$—contaminated diluent water is pumped tangentially across a series of fibers and/or a membrane having a relatively small pore size. For example, the tangential flow filters obtained from SPECTRUM LABS are equipped with a 13 liter Peristaltic Pump with Dual Autoclavable Flow-path stands, 4 Autoclavable Pressure gauges, and process Reservoirs; Process Volume: 300 ml to 100 Liter; Filtration Rate: 50 ml/min to 7.5 liters/min; Fiber Filters: e.g., 1 mm fiber ID, 20.8 cm length, 0.2 μm polyethersulfone membrane, 2000 cm² surface area.

Fiber ID: e.g., 0.5 mm or 1 mm

Membrane Pore Sizes: 0.05 μm(50 nm); 0.1 μm; 0.2 μm; or 0.5 μm. Membrane materials: polyethersulfone or cellulose ester; Filter length: 10 cm to several meters.

Any tangential flow filter apparatus, e.g., from Spectrumlabs, provides sufficient $Na^+$ ion removal for use of the purified clay as abrasive particles, as described herein. For economic reasons, it is preferred to use 1 mm fiber ID, short filter length (10 cm to 1 m), and small to median pore size (0.1 μm and 0.2 μm) filters.

The clay can be filtered multiple times through the tangential flow filters to achieve additional $Na^+$ ion removal and the purification process may also include additional ion-exchange steps before each filtration step in an attempt to remove additional $Na^+$ ions from the clay. Ion-exchange steps after the first ion-exchange obviously require less and less $Ca^{++}$ ions and/or $NH_4^+$ ions since less $Na^+$ is contained in the clay, e.g., five times the CEC instead of 20 times the CEC. After the final ion-exchange step, the clay suspension is filtered through the hollow fiber tangential flow apparatus until the total ion conductivity of the purified clay is lower than 200 μS (microSimens), preferably less than 100 μS. As shown in the following Table 1, it appears that 2 ion-exchange/hollow fiber filtration combinations are sufficient when ion-exchanging with $Ca^{++}$, and 3 ion-exchange/hollow fiber filtration combinations are sufficient when ion-exchanging the clay with $NH_4^+$ ions:

montmorillonite clay when dispersed in water, allowing the clay powder agglomerates to disperse into individual particles—is shown in Table II:

TABLE II

|  | (Ca-Mont) | ($NH_4$-Mont.) | Preferred Range |
|---|---|---|---|
| Mean Size (μm): | 1.33 | 1.21 | 0.5–5 μm |
| Std. Dev. (μm): | 0.96 | 0.81 | |

To achieve the full advantage of the purified clay abrasive particles, the mean particle size of the abrasive, purified clay particles should be in the range of about 0.5 to about 5.0 μm, preferably about 0.8 μm to about 4 μm.

A measure of the remaining sodium in the purified clays, as measured by ICP analysis, in a 2% by weight aqueous solution, is shown in Table III.

TABLE III

| ICP Analysis of Na | |
|---|---|
| Sample | (ppm) |
| (Ca-montmorillonite): | 6.7 |
| (NH4-montmorillonite): | 28 |

EXAMPLES

The following examples further illustrate the present invention but, of course, should not be construed as in any way limiting its scope.

Figure 3:
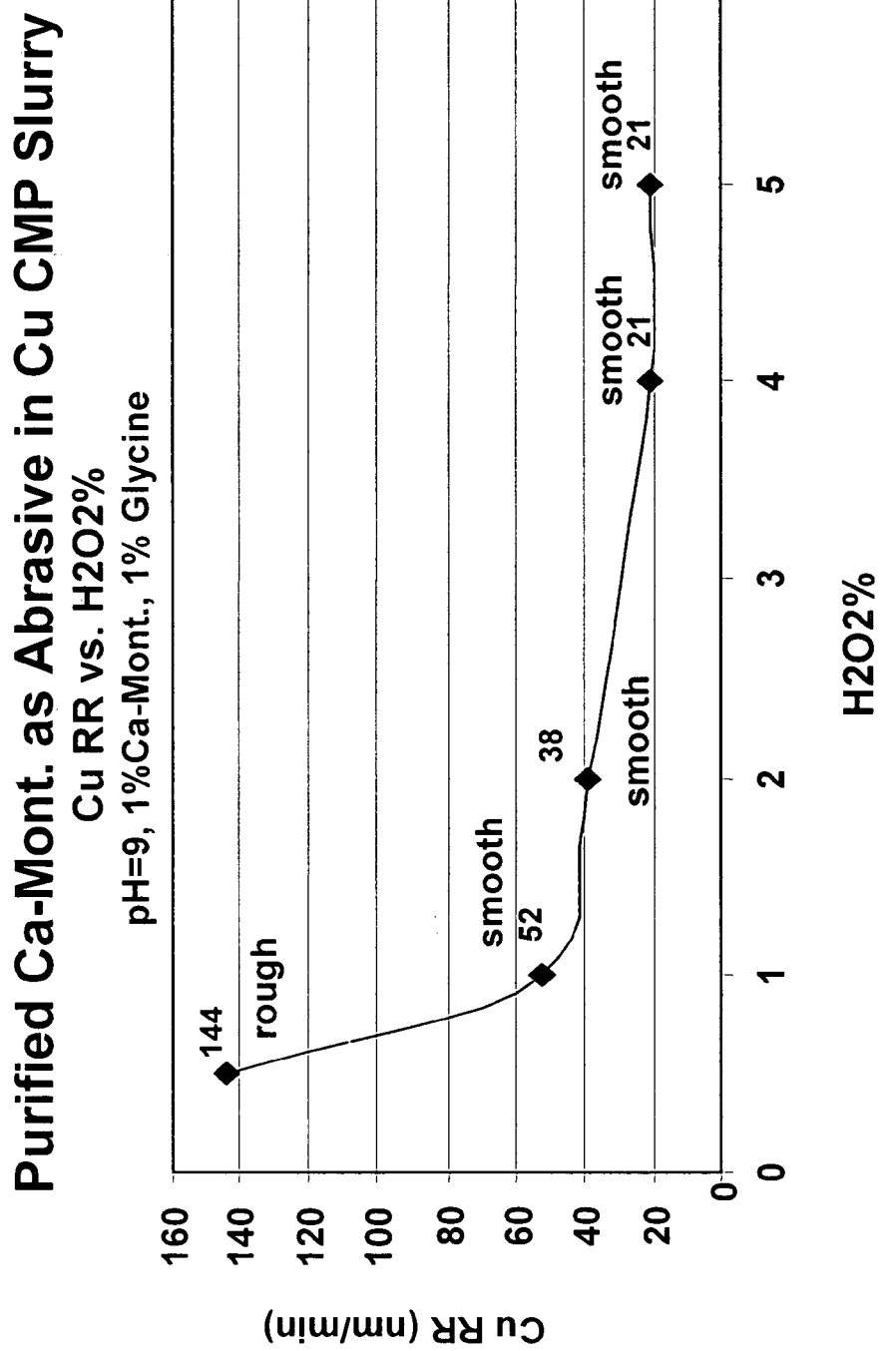
FIG. 3 is a graph showing the removal rate (RR) of copper (Cu) using a slurry composition containing 1 wt. % of calcium montmorillonite, 1 wt. % glycine complexing agent, and varying percentages of a hydrogen peroxide chemical accelerator (oxidizing agent)
Figure 4:
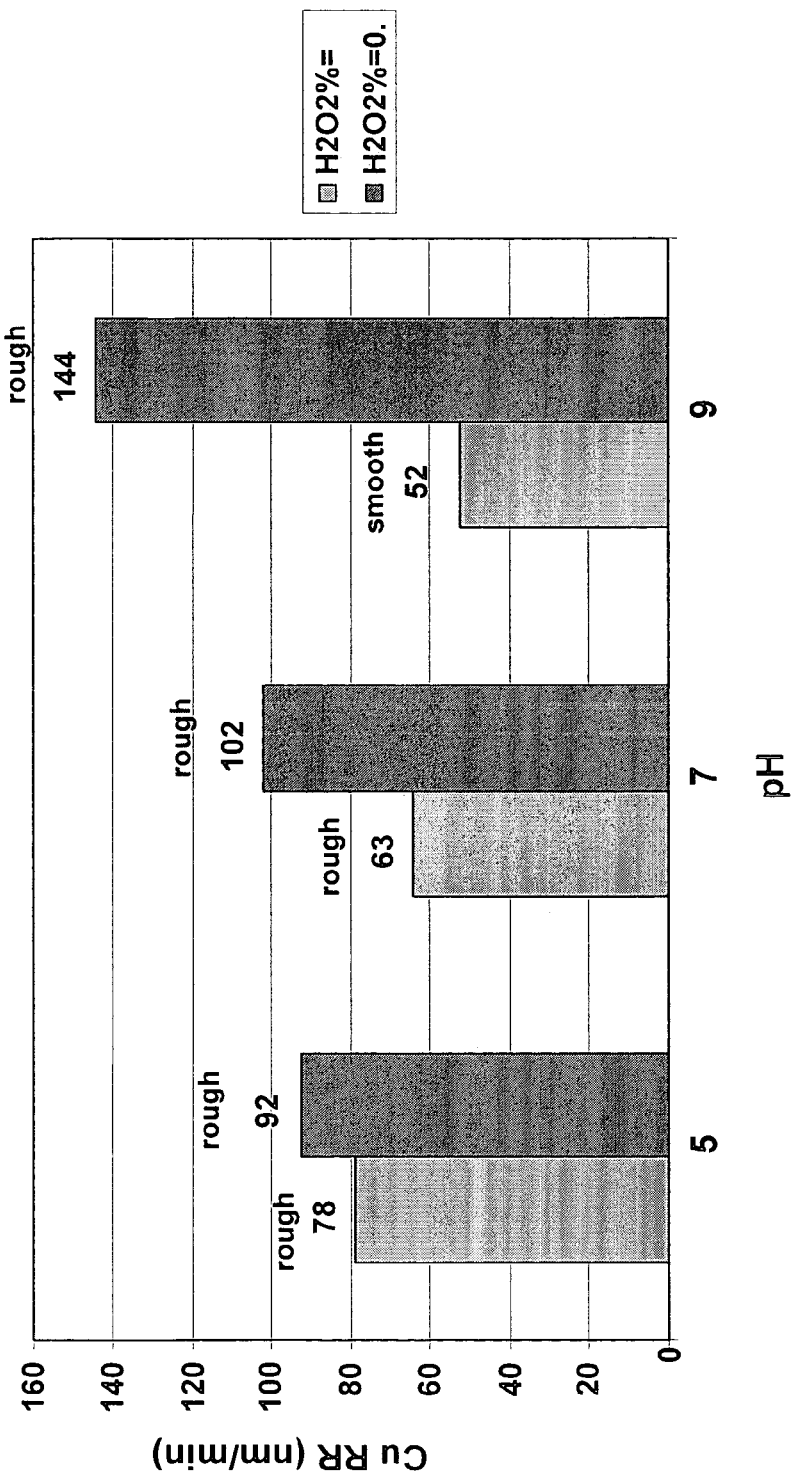
FIG. 4 is a graph showing the removable rate (RR) of copper (Cu) using a slurry composition containing 1 wt. % of calcium montmorillonite, 1 wt. % glycine complexing agent, and 0.5 wt. % or 1.0 wt. % of a hydrogen peroxide chemical accelerator (oxidizing agent), showing the Cu removal rate at varying slurry pHs.

FIGS. 3 and 4 are graphs showing the rate of copper removal using the slurry polishing compositions of the preferred embodiment (the calcium montmorillonite clay shown in Tables I and II. The polishing experiments were carried out using a bench-top Struers DAP-V polisher having a diameter of 31.75 mm for polishing 99.999% pure copper disks. The polishing pads were IC-1400 provided by Rodel, Inc. The pads were hand-conditioned with 220-grit sandpaper and a nylon brush before being used. The center-to-center distance between the disk and the pad was 5.5 cm. The polishing table and the disk holder are both rotated at a speed of 100 rpm in the same clockwise direction. The applied downward pressure is 5 psi and the slurry flow rate is 30 ml/min. The polishing rates were determined from the

TABLE I

| | | XRF Analysis of Na % | | |
|---|---|---|---|---|
| cations | Original wt % Na | 1st Exchanged wt % Na | 2nd Exchanged wt % Na | 3rd Exchanged wt % Na |
| $Ca^{++}$ | 2.70 | 0.020 (99.26% removed) | 0.019 (5% more removed) | 0.019 (0%) |
| $NH_4^+$ | 2.70 | 0.035 (98.7% removed) | 0.022 (37.1% more removed) | 0.018 (18.2% more removed) |

After ion-exchange and hollow fiber tangential flow filtration, the mean particle size of the preferred clays—purified calcium montmorillonite and purified ammonium mass loss of copper from the disks during 3 min, 6 min, 9 min, and 12 min polishing runs and the reported values are the average of these four runs.

What is claimed is:

1. A method of planarizing or polishing a surface comprising contacting a surface with a composition comprising (a) a liquid carrier, and (b) solids comprising about 10 to 100 wt. % of ion-exchanged smectite clay abrasive particles, based on the total weight of solids in the composition, wherein about 90% or more of the abrasive particles (by number) have a particle size in the range of about 0.02 μm to 20 μm, wherein said ion-exchanged smectite clay abrasive particles are prepared by forming a mixture of the smectite clay in water, said smectite clay including exchangeable sodium interlayer cations, adding a water-soluble salt to said water, said water-soluble salt capable of solubilizing to provide exchange cations in said water, said exchange cations selected from the group consisting of ammonium cations, any alkali metal cations and alkaline earth metal cations except for lithium or sodium; ion-exchanging said exchange cations for exchangeable cations in the smectite clay to form an ion-exchanged smectite clay;

separating a majority of the sodium-containing water from the ion-exchanged clay.

2. The method of claim 1 wherein the separated, ion-exchanged clay is dried, re-wetted with water and again filtered from the added water, containing additional sodium ions, by flowing the mixture of ion-exchanged clay and the water over a hollow-fiber tangential flow filtration apparatus to separate a majority of the sodium-containing water from the ion-exchanged clay.

3. The method of claim 1, wherein the surface is an integrated circuit, a memory disk, or a rigid disk surface.

4. The method of claim 1, wherein the composition further includes a chemical accelerator selected from the group consisting of a peroxide, a sulfate, a persulfate, and a nitrate.

5. The method of claim 4, wherein the chemical accelerator is selected from the group consisting of hydrogen peroxide, ammonium persulfate, iron (III) nitrate, and hydroxylamine nitrate.

6. The method of claim 1, wherein sufficient cations are added to the mixture of smectite clay and water to provide complete exchange of the cations for the exchangeable cations in the smectite clay.

7. The method of claim 1, wherein the ion-exchanged smectite clay has a particle size in the range of 0.02 μm to 10 μm, when slurried in water.

8. The method of claim 1, wherein the majority of the sodium-containing water is separated from the ion-exchanged clay by filtering the water, containing sodium ions, from the mixture of the ion-exchanged clay and the water by flowing the mixture of ion-exchanged clay and water over a hollow fiber tangential flow filtration apparatus.

9. The method of claim 7, wherein the ion-exchanged smectite clay has a particle size in the range of 0.05 μm to 5 μm, when slurried in water.

10. The method of claim 9, wherein the ion-exchanged smectite clay has a particle size in the range of 0.1 μm to 4 μm, when slurried in water.

* * * * *

UNITED STATES PATENT AND TRADEMARK OFFICE
CERTIFICATE OF CORRECTION

PATENT NO. : 7,087,529 B2
APPLICATION NO. : 10/677433
DATED : August 8, 2006
INVENTOR(S) : Fang et al.

It is certified that error appears in the above-identified patent and that said Letters Patent is hereby corrected as shown below:

Title Page, Item (57) Abstract, After,
"A chemical-mechanical abrasive composition for use in semiconductor processing uses abrasive particles having a non-spherical morphology." insert -- Compositions and methods for planarizing or polishing a surface, particularly a semiconductor wafer surface. The polishing compositions described herein comprise (a) a liquid carrier; (b) purified clay; and optional additives, such as (c) a chemical accelerator; and (d) a complexing or coupling agent capable of chemically or ionically complexing with, or coupling to, the metal and/or insulating material removed during the polishing process. The complexing or coupling agent carries away the removed metal and/or silicon dioxide insulator particles, during polishing, to prevent the separated particles from returning to the surface from which they were removed. Also disclosed are methods of planarizing or polishing a surface comprising contacting the surface with the compositions. --

Signed and Sealed this

Sixth Day of March, 2007

JON W. DUDAS
*Director of the United States Patent and Trademark Office*